(12) United States Patent
Richter et al.

(10) Patent No.: US 11,393,962 B2
(45) Date of Patent: Jul. 19, 2022

(54) OPTOELECTRONIC SEMICONDUCTOR COMPONENT AND ASSEMBLY HAVING AN OPTOELECTRONIC SEMICONDUCTOR COMPONENT

(71) Applicant: OSRAM OLED GmbH, Regensburg (DE)

(72) Inventors: Daniel Richter, Bad Abbach (DE); Sven Weber-Rabsilber, Neutraubling (DE)

(73) Assignee: OSRAM OLED GMBH, Regensburg (DE)

( * ) Notice: Subject to any disclaimer, the term of this patent is extended or adjusted under 35 U.S.C. 154(b) by 144 days.

(21) Appl. No.: 16/626,899

(22) PCT Filed: Jun. 21, 2018

(86) PCT No.: PCT/EP2018/066655
§ 371 (c)(1),
(2) Date: Dec. 27, 2019

(87) PCT Pub. No.: WO2019/002098
PCT Pub. Date: Jan. 3, 2019

(65) Prior Publication Data
US 2020/0176653 A1 Jun. 4, 2020

(30) Foreign Application Priority Data
Jun. 30, 2017 (DE) .................... 10 2017 114 668.7

(51) Int. Cl.
*H01L 33/62* (2010.01)
*H01L 33/48* (2010.01)
*H01L 25/075* (2006.01)

(52) U.S. Cl.
CPC ............ *H01L 33/62* (2013.01); *H01L 33/486* (2013.01)

(58) Field of Classification Search
CPC ....... H01L 33/62; H01L 33/486; H01L 23/12; H01L 23/48
See application file for complete search history.

(56) References Cited

U.S. PATENT DOCUMENTS 6,861,737 B1 * 3/2005 Jeong ...................... H01L 23/13
257/666
2004/0240203 A1 12/2004 Matsumura et al.
(Continued)

FOREIGN PATENT DOCUMENTS

EP 2071641 A2 6/2009
EP 2110866 A1 10/2009
(Continued)

OTHER PUBLICATIONS

German Search Report based on Application No. 10 2017 114 668.7, dated Februray 15, 2018, 8 pages (for reference purpose only).
(Continued)

*Primary Examiner* — Marcos D. Pizarro
*Assistant Examiner* — Antonio B Crite
(74) *Attorney, Agent, or Firm* — Viering, Jentschura & Partner mbB

(57) ABSTRACT

An optoelectronic semiconductor component may include a housing having a recess, and a chip carrier which is a part of the housing. The chip carrier may have a first fastening side and an upper side. The optoelectronic semiconductor chip may be mounted on the upper side in the recess. First electrical contact pads for external electrical contacting may be located on the first fastening side. Furthermore, second electrical contact pads for external electrical contacting may be located on a second fastening side, opposite to the first fastening side, of the housing. First and second electrical contact pads electrically assigned to one another may be electrically short-circuited so that the semiconductor com-
(Continued)

ponent can be electrically contacted by the first or by the second fastening side.

16 Claims, 6 Drawing Sheets

(56) References Cited

U.S. PATENT DOCUMENTS

| | | |
|---|---|---|
| 2009/0189177 A1* | 7/2009 | Lee .................. H01L 33/54 |
| | | 257/99 |
| 2010/0025722 A1 | 2/2010 | Wada |
| 2011/0163683 A1 | 7/2011 | Steele et al. |
| 2014/0061682 A1 | 3/2014 | Kobayashi et al. |
| 2014/0291720 A1 | 10/2014 | Lo et al. |

FOREIGN PATENT DOCUMENTS

| | | | |
|---|---|---|---|
| KR | 20110075676 A | 7/2011 | |
| WO | WO-2016162433 A1 * | 10/2016 | ............. H01L 33/62 |

OTHER PUBLICATIONS

International Search Report based on Application No. PCT/EP2018/066655, dated Sep. 20, 2018, 15 pages + 2 pages English Translation (for reference purpose only).

* cited by examiner

A)

B)

C)

D)

OPTOELECTRONIC SEMICONDUCTOR COMPONENT AND ASSEMBLY HAVING AN OPTOELECTRONIC SEMICONDUCTOR COMPONENT

CROSS-REFERENCE TO RELATED APPLICATIONS

The present application is a national stage entry according to 35 U.S.C. § 371 of PCT application No.: PCT/EP2018/066655 filed on Jun. 21, 2018; which claims priority to German Patent Application Serial No.: 10 2017 114 668.7, which was filed on Jun. 30, 2017; both of which are incorporated herein by reference in their entirety and for all purposes.

TECHNICAL FIELD

An optoelectronic semiconductor component is provided. Furthermore, an arrangement having an optoelectronic semiconductor component is provided.

BACKGROUND

An object to be achieved is to provide an optoelectronic semiconductor component which is flexibly usable.

SUMMARY

This object is achieved, inter alia, by an optoelectronic semiconductor component and by an arrangement having the features of the independent patent claims.

According to at least one embodiment, the optoelectronic semiconductor component includes a housing. There is at least one recess, in particular precisely one recess, in the housing, although there may also be a plurality of recesses. The housing is a component which mechanically supports and stabilizes the semiconductor component.

According to at least one embodiment, the housing includes a chip carrier. The chip carrier has a first fastening side and an upper side. The upper side lies opposite the first fastening side. In particular, the first fastening side and the upper side are the two main sides of the chip carrier. The fastening side and the upper side may be oriented parallel to one another.

According to at least one embodiment, the semiconductor component includes one or more optoelectronic semiconductor chips. The at least one semiconductor chip is a light-emitting diode, abbreviated to LED. As an alternative, it may be a laser diode.

According to at least one embodiment, the at least one semiconductor chip is mounted on the upper side of the chip carrier. For example, the semiconductor chip is soldered or electrically conductively adhesively bonded on the upper side. Current to the semiconductor chip is carried out through the chip carrier. The semiconductor chip may be electrically and mechanically mounted directly on the chip carrier.

According to at least one embodiment, the semiconductor chip is located in the recess, such as fully located in the recess. That is to say, the semiconductor chip does not protrude through either in a direction parallel nor in a direction perpendicular to the upper side of the housing.

According to at least one embodiment, the first electrical contact pads for external electrical contacting of the semiconductor component are located on the first fastening side. In particular, the electrical contact pads each represent at least one anode and cathode of the semiconductor component, and are adapted for corresponding electrical contacting. In a non-limiting embodiment, the electrical contact pads are adapted for surface mounting, so that the semiconductor component is SMT-handleable.

According to at least one embodiment, the semiconductor component includes second electrical contact pads for external electrical contacting. The second electrical contact pads are located on a second fastening side, opposite to the first fastening side, of the housing. It is possible for the first fastening side and the second fastening side to be oriented parallel to one another. The two fastening sides form the main sides of the housing. Furthermore, the two fastening sides are adapted for surface mounting.

According to at least one embodiment, first and second contact pads electrically assigned to one another are electrically short-circuited or electrically connected to one another in an electrically short-circuited fashion. This means, in particular, that there are a plurality of differently functionalized electrical contact pads on the first fastening side, and the second fastening side as corresponding functionalized electrical contact pads. In particular, there is a 1-to-1 assignment between the contact pads on the first and the second fastening sides.

This means, for instance, that the first and second fastening sides include electrically equivalent configured connection possibilities, produced by the first and second electrical contact pads. The semiconductor component may therefore be electrically contacted equally by the first fastening side and by the second fastening side. Correspondingly, the semiconductor component may equally be mounted with the first fastening side or alternatively with the second fastening side facing toward a fastening surface, such as a mounting carrier.

In at least one embodiment, the optoelectronic semiconductor component includes a housing having a recess, and a chip carrier which is a part of the housing and has a first fastening side and an upper side. At least one optoelectronic semiconductor chip is mounted on the upper side, fully in the recess. First electrical contact pads for external electrical contacting of the semiconductor component are located on the first fastening side. Furthermore, second electrical contact pads for external electrical contacting of the semiconductor component are located on a second fastening side, opposite to the first fastening side, of the housing. Electrical contact pads electrically assigned to one another are electrically short-circuited so that the semiconductor component can be electrically contacted by the first fastening side or by the second fastening side.

The semiconductor component is therefore a component which may be mounted both forward and backward, a light-emitting surface being coplanar with upper-side solder contacts in the case of backward mounting. Backward mounted means that an emission side of the semiconductor component faces toward a fastening platform. In the case of forward mounting, the emission side faces away from the fastening platform.

Alternative possibilities for components consist in using outwardly routed and bent lead frames. With this approach, however, relatively high production tolerances occur. In this way, easy tilting of the component may take place. Furthermore, prefabricated base housings with bent lead frames present a high risk of some air inclusions during casting and/or encapsulation of the component, in particular at the customer end. In this case, the same component may be mounted either forward or backward. Such components having protruding and/or bent lead frames are disclosed for example in Document WO 97/50132 A1, see for instance FIGS. 1 and 10.

A further approach is based on a printed circuit board, on which LED chips are located, remaining free in edge regions and containing a solderable metallization. In this case, the solder surfaces for backward mounting are not coplanar with the light-emitting surface. This is problematic particularly if the carrier is not optically transmissive. Such components are, for example, configured like the CHIPLED-0603, LT Q39G, from the manufacturer OSRAM Opto Semiconductors.

With the semiconductor component described here, backward mounting or forward mounting of the same component may be carried out, wherein a light-emitting surface is coplanar with electrical contact pads and, at the same time, bubble-free installation is possible and low manufacturing tolerances may be complied with.

In particular, in the case of the semiconductor component described here, a printed circuit board, also referred to as a PCB, is used as a substrate and as a preform. In this case, solder contacts are produced on a rear side, and a front side is provided with metallizations for mounting semiconductor chips and bond wires. Furthermore, through-contacts are formed between the metallizations on both sides. An additional laminate is thereupon structured, for example by means of stamping. This structured laminate is laminated onto the prepared substrate so that a recess is formed. The semiconductor chips are thereupon put in position, electrically connected with bond wires and optionally provided with a filler. Lastly, singulation is carried out, for instance by means of sawing, as well as curing steps if necessary. As an alternative or in addition to a PCB, a ceramic carrier or a metal-core circuit board, abbreviated to MCPCB, may also be used as a preform and/or substrate and/or base body.

In this way, solder surfaces and light-emitting surfaces which are coplanar may be produced. In particular, this then offers advantages when the radiation produced is coupled directly into a waveguide or a planar transparent carrier substrate. The contact pads of the component may be maximized in terms of their area. This is helpful particularly in the case of potentially high-ohmic contacts or connection lines. By the possibility of mounting the component either forward or backward, many applications may be addressed by means of the same semiconductor component. This may lead to a reduction of the product portfolio required. By the cuboid shape, furthermore, any air inclusions when casting around the circuit board, already mounted with components by a customer and/or during final mounting, may be avoided.

According to at least one embodiment, the chip carrier is formed by a circuit board, in particular a printed circuit board and/or a metal-core circuit board. In this case, the upper side is provided with electrical connection surfaces. The electrical connection surfaces are adapted to be electrically connected directly to the semiconductor chip. In this case, as well as in all other embodiments, besides the semiconductor chip additional electronic parts such as protective diodes for detection against damage by electrostatic discharge, abbreviated to ESD, may be provided.

According to at least one embodiment, the connection surfaces are connected to the first contact pads by means of through-contacts. In this case, an electrically one-to-one assignment is carried out between the connection surfaces and the contact pads. That the through-contacts extend through the chip carrier may mean that, as seen in plan view, the through-contacts are enclosed circumferentially by a material of the chip carrier, in particular by material of a base body of the chip carrier. Furthermore, it is possible for the through-contacts to extend on side surfaces of such a base carrier and be freely accessible laterally.

According to at least one embodiment, the connection surfaces together with the through-contacts and the first and second contact pads are E-shaped as seen in cross section. This means, in particular, that the connection surfaces and the first and second contact pads lie in three different planes oriented parallel to one another. In this case, the connection surfaces are located on a central plane of these three planes. The three planes are electrically connected to one another perpendicularly to these planes by the through-contact, which in particular extends continuously and in a straight line. As seen in cross section, the connection surfaces respectively assigned to one another and the associated first and second electrical contact pads may be flush with one another at only one end or at two mutually opposite ends. Likewise, the through-contacts may be flush with the respective connection surface in question and the associated contact pads in a direction parallel to the planes.

According to at least one embodiment, the through-contacts extend partially or, alternatively, fully along housing side surfaces and/or along housing outer edges of the housing. These housing side surfaces and housing outer edges are oriented perpendicularly or approximately perpendicularly to the upper side and/or the fastening sides. The term "approximately" in connection with angle specifications means, for example, a tolerance of utmost 25° or 10° or 5°. In a direction perpendicular to the fastening sides, the housing side surfaces and/or housing outer edges may at least at some positions of the housing be covered fully by a material of the through-contacts, in particular formed by at least one metal layer.

According to at least one embodiment, the chip carrier is formed by a lead frame. The lead frame may include one or, alternatively, a plurality of lead frame parts. The individual lead frame parts are electrically connected to one another not directly but rather, for example, only by means of the light-emitting semiconductor chip and/or by means of an ESD chip. The lead frame is made from one or more metals, for instance from copper or a copper alloy, optionally with for instance metal coatings to improve the optical properties or to improve the electrical contactability.

According to at least one embodiment, the semiconductor chip is mounted, for example soldered or electrically conductively adhesively bonded, on the lead frame. If there are a plurality of semiconductor chips, each of the semiconductor chips is mounted on its own separate lead frame part.

According to at least one embodiment, the lead frame extends from the semiconductor chip as far as the first fastening side. In particular, the first contact pads are therefore formed partially or fully by the lead frame. In this case, each electrical contact pad may be formed by one of the lead frame parts of the lead frame. In particular, there is a one-to-one assignment between the lead frame parts and the first electrical contact pads.

According to at least one embodiment, the housing includes a casting body. It is possible for the lead frame to be embedded in the casting body and/or mechanically stabilized by the casting body. In particular, the lead frame parts are mechanically coupled to one another firmly by the casting body.

According to at least one embodiment, the recess is formed in the casting body, particularly only in the casting body. The second fastening side is therefore formed by the casting body.

According to at least one embodiment, the second contact pads are connected to the lead frame and the corresponding lead frame parts by means of through-contacts through the casting body. In this case, by means of the through-contacts, there is a one-to-one assignment between the corresponding lead frame parts of the lead frame and the associated second contact pads.

According to at least one embodiment, the through-contacts are covered, in particular fully covered, by the second contact pads. This means that, as seen in plan view, the through-contacts in question cannot be seen because of the assigned contact pads.

According to at least one embodiment, the recess is free of the second contact pads and free of the through-contacts. In particular, side walls of the recess, which are formed by a material of the casting body, are free. This means that no electrically functionalized parts are mounted on the side walls of the recess.

According to at least one embodiment, the second contact pads are electrically connected to the lead frame by means of conductive tracks, such as in a one-to-one fashion. The conductive tracks may extend along side walls of the recess, in particular directly on a material of the casting body.

According to at least one embodiment, housing side surfaces of the housing are free of electrically functionalized parts of the semiconductor component. The housing side surfaces in this case connect the two fastening sides to one another. As seen in cross section, the casting body is limited on the one hand by the outer-lying housing side surfaces and on the other hand by the inner-lying side walls of the recess.

According to at least one embodiment, the housing includes one or more thickening bodies. The at least one thickening body is mounted on the upper side of the chip carrier, for example by means of soldering or adhesive bonding. In particular, the thickening body is laminated onto the chip carrier.

According to at least one embodiment, the recess is limited to the thickening body. The chip carrier may therefore be free of the recess. If possible elevations due to the connection surfaces and conductive tracks on the upper side are neglected, the upper side of the chip carrier is configured in a flat and planar fashion.

According to at least one embodiment, as seen in a plan view of the upper side, the thickening body partially covers the connection surfaces and/or conductive tracks, which extend to the connection surfaces. It is possible for the conductive tracks to be fully covered by the thickening body. The connection surfaces and/or the conductive tracks may therefore be clamped between the thickening body and a base body of the chip carrier.

According to at least one embodiment, the second fastening side is formed partially or fully by the thickening body. This means that the second contact pads are partly or fully located directly on the thickening body.

According to at least one embodiment, the semiconductor component includes two or three or more than three semiconductor chips emitting different colors and electrically drivable independently of one another. In particular, at least one semiconductor chip for generating red light, at least one semiconductor chip for generating green light and at least one semiconductor chip for generating blue light are provided. The semiconductor component may therefore be a so-called RGB component. If there are a plurality of semiconductor chips for generating radiation of a particular color, these semiconductor chips may be electrically handleable as a unit or as groups, and may for example be located together on a single connection surface.

According to at least one embodiment, the semiconductor chips are mounted in a common plane. This plane is, in particular, formed by the upper side. This means that there is no height offset in a direction perpendicular to the upper side between neighboring semiconductor chips.

According to at least one embodiment, the housing is opaque to visible light. For example, the housing is made of a white plastic or of a white ceramic, so that light is reflected diffusely. As an alternative, the housing may be specularly reflective, for example because of correspondingly applied coatings, for instance on the side walls of the recess and/or on the upper side inside the recess. It is furthermore possible for the housing to be absorbent for light and, for example, formed by a black material, for instance an epoxide into which carbon black particles are incorporated.

According to at least one embodiment, the semiconductor chips are electrically contacted by bond wires. The bond wires are fully located in the recess, so that the bond wires do not protrude beyond the second fastening side.

An arrangement is furthermore provided. The arrangement includes one or more of the optoelectronic semiconductor components as provided in connection with one or more of the embodiments mentioned above. Features of the arrangement are therefore also disclosed for the optoelectronic semiconductor components, and vice versa.

According to at least one embodiment, the arrangement includes a plurality of the optoelectronic semiconductor components. The arrangement furthermore includes a mounting platform. The mounting form is reflective or transmissive for the radiation generated. Reflective means, for example, a reflectance for visible light of at least 60% or 80%.

According to at least one embodiment, the mounting platform includes one or more electrical feeds. The semiconductor components are mounted electrically, and optionally also mechanically, on the electrical feeds. The electrical feeds may be conductive tracks and/or electrical connection surfaces of the mounting platform.

According to at least one embodiment, an average distance between neighboring semiconductor components on the mounting platform is greater by a factor of at least 5 or 10 or 20 or 50 than an average diagonal length of the semiconductor components. This applies particularly as seen in plan view. This means that the semiconductor components are arranged on the mounting platform while being spaced relatively far apart from one another. A coverage factor of the mounting platform by the semiconductor component is therefore negligible.

In particular, during intended use of the arrangement, an optical impression of the mounting platform is not, or not significantly, impaired by the semiconductor components. In other words, during intended use of the arrangement, the semiconductor components, cannot be seen, or can be seen only with difficulty, by a user in the off state.

According to at least one embodiment, the semiconductor components are bonded electrically conductively onto the electrical feeds by an adhesive. In this case, the electrical feeds are optically transmissive. For example, the electrical feeds are made of an electrically conductive oxide, abbreviated to TCO, such as ITO.

According to at least one embodiment, the adhesive extends from the fastening side facing toward the electrical feeds as far as the fastening side facing away from the electrical feeds. That is to say, electrical contacting takes place equally by means of the first and second contact pads. In this case, the housing side surfaces of the housing may be partially covered, in particular directly covered, by the adhesive. It is possible for the first contact pads and/or the second contact pads and/or exposed parts of the through-contacts to be fully covered by the adhesive. The adhesive may have a wetting effect of the contact pads and/or for the through-contacts.

According to at least one embodiment, some of the semiconductor components in the arrangement have a first principal emission direction and the remaining semiconductor components have a second principal emission direction. The first and second principal emission direction are oriented antiparallel to one another. That is to say, some of the semiconductor components emit for example downward, while the remaining semiconductor components emit upward.

According to at least one embodiment, the mounting platform includes a first plate and a second plate. In a non-limiting embodiment, the two plates are optically transmissive. As an alternative, one of the plates is optically transmissive and the other plate is reflective for visible light.

According to at least one embodiment, the semiconductor components are mounted between the two plates. An electrical feed to the semiconductor components may therefore be divided between the two plates. In this way, the electrical feeds may be configured to be thinner and also optically transmissive.

According to at least one embodiment, the semiconductor components are each electrically and/or mechanically connected only either to the first plate or to the second plate. It is possible for the semiconductor components respectively to touch only one of the plates. In this case, the two plates are oriented parallel to one another. Spacers, which may be placed between the semiconductor components, may be provided between the plates.

BRIEF DESCRIPTION OF THE DRAWINGS

A semiconductor component as described here and an arrangement as described here will be explained in more detail below with reference to the drawing. References which are the same in this case indicate elements which are the same in the individual figures. The referencing is not true to scale, however, but instead individual elements may be represented exaggeratedly large for better understanding.

DETAILED DESCRIPTION

FIGS. 1 to 4 represent a production method for an optoelectronic semiconductor component 1. Figure parts A show sectional representations, and figure parts B show plan views. The section in figure parts A extends, in particular, along a diagonal of the plan views in figure parts B.

Figure 1:
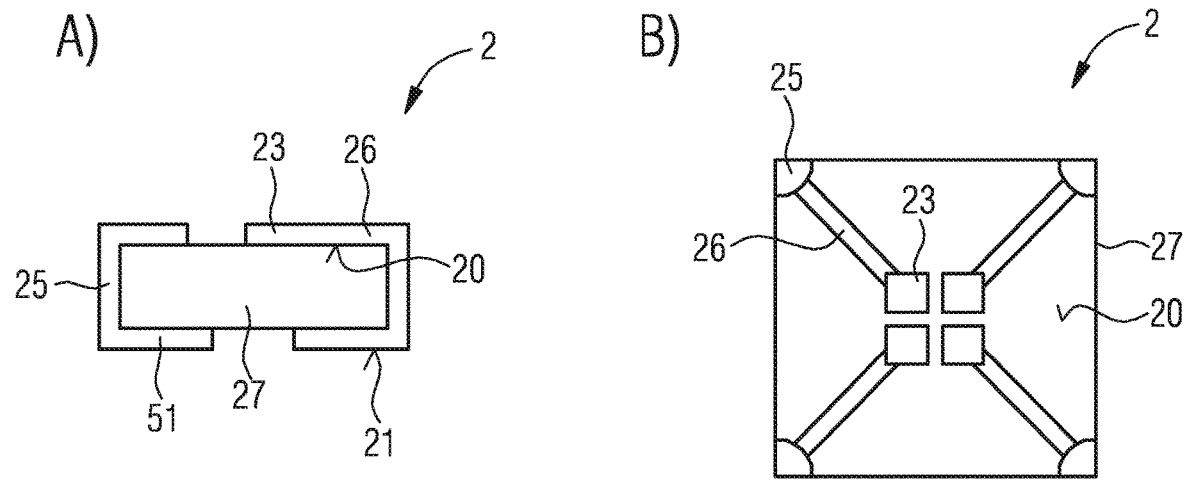
FIGS. 1 to 5 show schematic sectional representations and plan views of method steps for the production of optoelectronic semiconductor components as described here.

According to FIG. 1, a chip carrier 2 is provided. The chip carrier 2 is, for instance, a printed circuit board. A plurality of first electrical contact pads 51 are applied on a first fastening side 21. By means of through-contacts 25, the first contact pads 51 connects to electrical connection surfaces 23 and conductive tracks 26 on an upper side 20. The first contact pads 51, the through-contacts 25, the conductive tracks 26 and the connection surfaces 23 are respectively formed by one or more metal layers. The base body 27 is for example made of a resin, and may include fiber reinforcement. The through-contacts 25 extend on side surfaces of the base body 27.

For example, precisely four contact services 23 are provided which are connected by means of the conductive tracks 26 to the through-contacts 25 in a one-to-one fashion. Likewise, there may be a one-to-one assignment between the through-contacts 25 and the first contact pads 51. The through-contacts 25 are located at corners of the base body 27 as seen in plan view. The conductive tracks 26 therefore extend in an X-shape as seen in plan view, and the connection surfaces 23 are applied in a square arrangement in the middle of the chip carrier 2.

Figure 2:
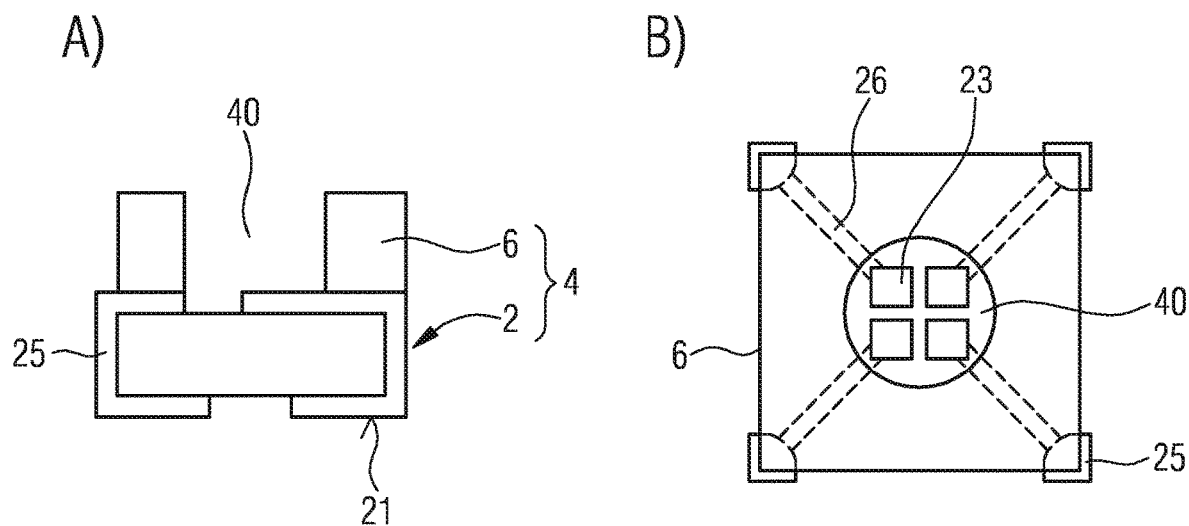

According to FIG. 2, a thickening body 6 is applied on the chip carrier 2. The thickening body 6 is a prestructured laminate, which is laminated or adhesively bonded onto the chip carrier 2. The thickening body 6 is configured in one piece. A recess 40 is formed through the thickening body 6. The thickening body together with the chip carrier 2 forms a housing 4 of the finished semiconductor component 1.

As may be seen in FIG. 2B, it is possible for the through-contacts 25 to protrude laterally beyond the thickening body 6. As an alternative, the thickening body 6 may partially or fully cover the through-contacts 25 or be flush with the through-contacts 25.

Figure 3:
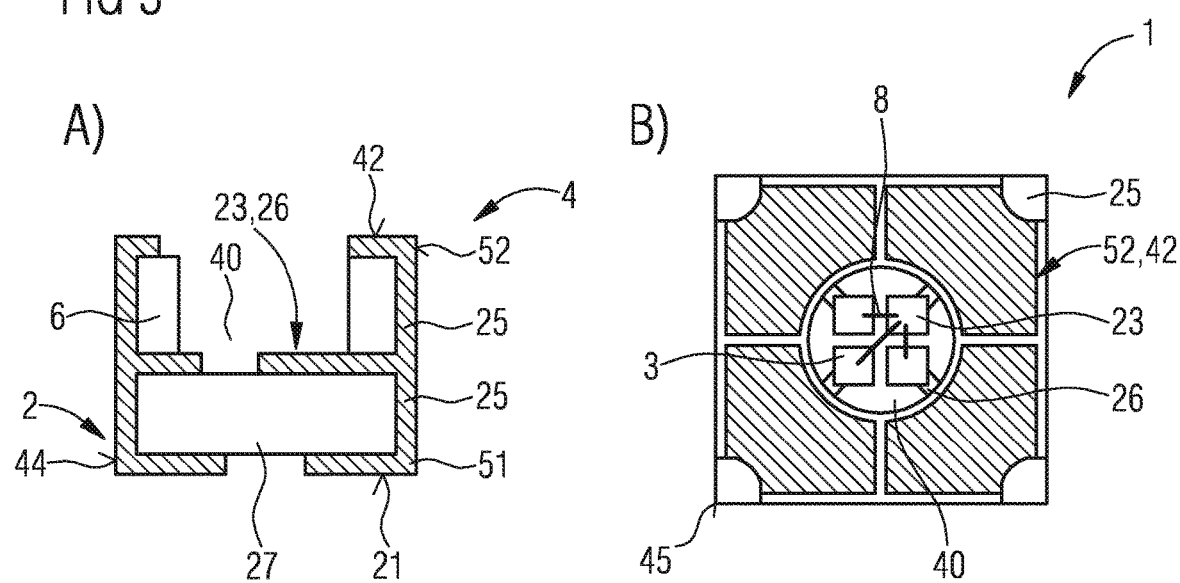

In the method step of FIG. 3, the through-contacts 25 on housing surfaces 44 are extended beyond the thickening body 6, and second electrical contact pads 52 are produced, for example by electroplating, on a side of the thickening body 6 facing away from the chip carrier 2. The second fastening side 42 of the semiconductor component 1 is formed by the second contact pads 52.

As seen in cross section, the contact pads 51, 52 together with the connection surfaces 23 and the conductive tracks 26 as well as the through-contacts 25 are configured in an E-shape. In this case, the three transverse bars of the E have different transverse extentions, as illustrated in FIG. 3A.

The second contact pads 52 do not extend directly into the recess 40, see FIG. 3B. It is possible that all the second connection surfaces 52 have the same base shape as seen in plan view and can be imaged into one another by rotation through 90°. The second contact pads 52 cover a large part of the second fastening side 42. In particular, the second contact pads 52 are arranged as quadrants. The same may apply for the first contact pads 51.

FIG. 3B furthermore illustrates that three optoelectronic semiconductor chips 3 emitting different colors are mounted in the recess 40. The semiconductor chips 3 are LED chips. Each of the semiconductor chips 3 is applied, such as soldered, on one of the connection surfaces 23. A respective second electrical contact with the semiconductor chips 3 extends via bond wires 8 to the remaining fourth connection surface 23, so that the semiconductor chips 3 may be electrically driven individually.

In contrast to FIG. 3, it is also possible for there to be a separate recess for each of the semiconductor chips 3 or for each group of semiconductor chips 3 emitting the same color.

Figure 4:
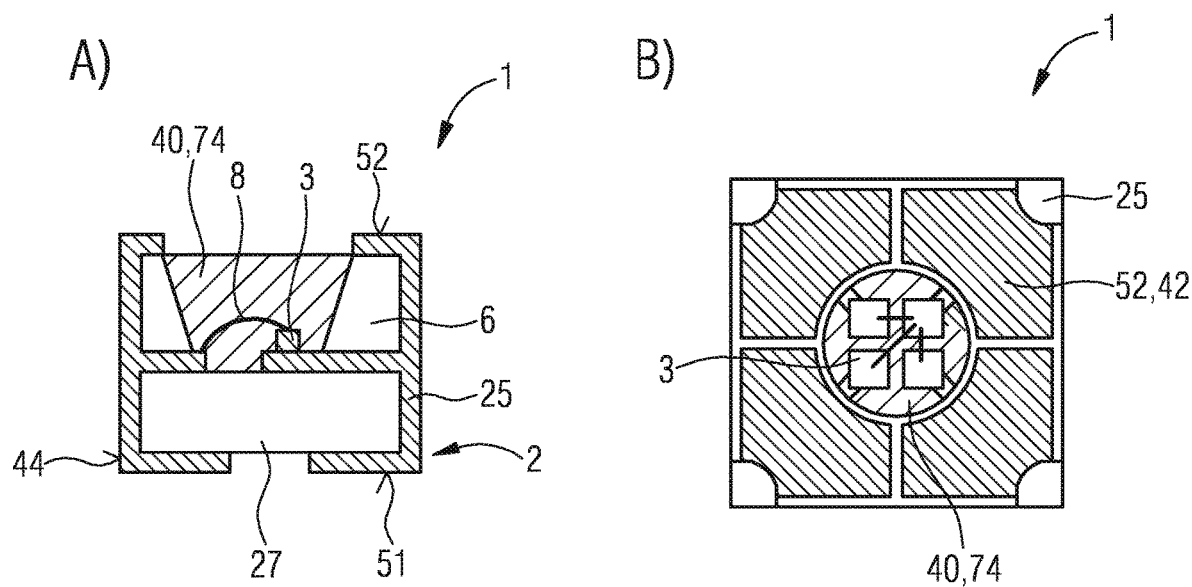

In the optional method step of FIG. 4, the recess 40 is provided with a filler 74. In contrast to the representation in FIG. 4A, the filler 74 may also be formed as optics, for example as a converging lens. The filler 74 is for example a clear casting compound, for instance made of a silicone. As an alternative, the filler 74 may include light-scattering particles in order to homogenize an emission characteristic of the semiconductor component 1.

In contrast to the representation in FIG. 4, it is also possible for a separate filler to be assigned to each of the semiconductor chips 3, possibly also in a respective separate recess. In this way, the individual semiconductor chips 3 may for example be provided with different luminescent materials. It is therefore possible to use structurally equivalent semiconductor chips 3, which ultimately emit light of different colors by means of different luminescent materials.

A thickness of the chip carrier 2 is, for example, at least 20 μm 50 μm or 100 μm and/or at most 2 mm or 1 mm or 0.5 mm. A thickness of the thickening body 6 is, for example, at least 200 μm and/or at most 2 mm or 1 mm or 0.5 mm. An overall thickness of the semiconductor component 1 is therefore, for example, at least 0.4 mm or 0.6 mm and/or at most 4 mm or 1 mm or 0.7 mm. Lateral dimensions of the semiconductor component 1 are, for example, at least 1 mm×1 mm and/or at most 5 mm×5 mm. The same also applies for all other exemplary embodiments.

Figure 5:
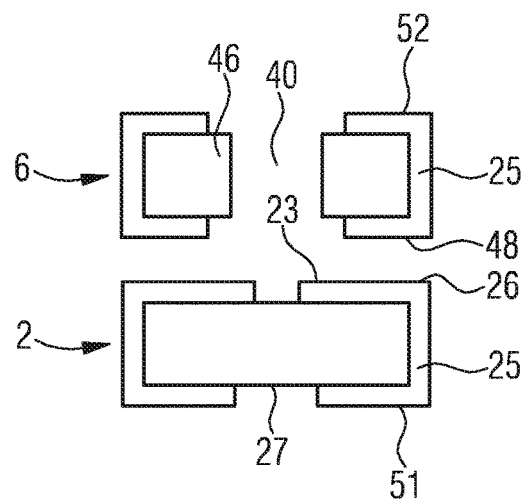
Figure 5:
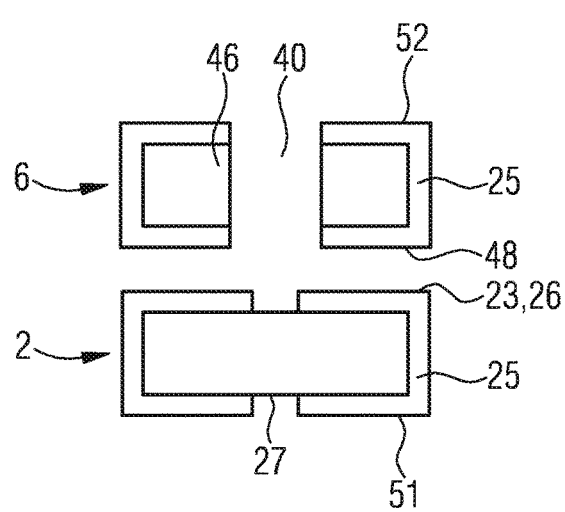
Figure 5:
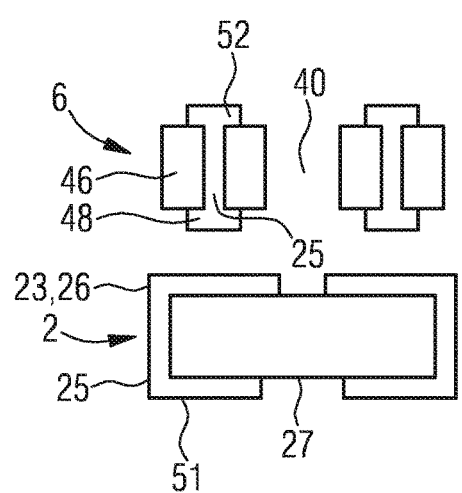
Figure 5:
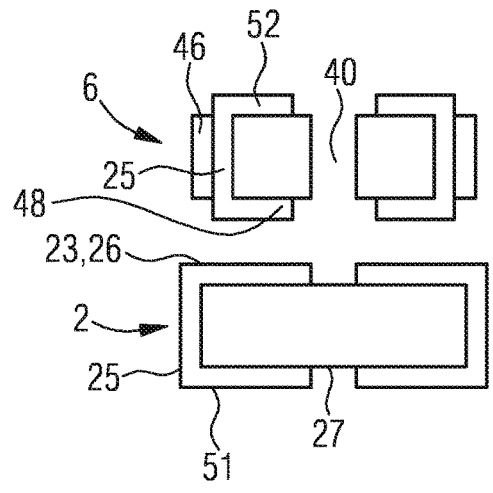

In the sectional representations of FIG. 5, alternative embodiments of the method step of FIG. 2 are illustrated. In this case, a structured printed circuit board, in which the central recess 40 is formed, is respectively used as the thickening body 6. As also in all other exemplary embodiments, it is possible for the recess 40 not to be enclosed all around by a material of the thickening body 6 but instead, for example, include a separating slot or a gap or a plurality of separating slits or gaps, as seen in plan view.

According to FIG. 5A, electrical junction surfaces 48 are provided for soldering or electrically conductive adhesive bonding on the thickening body 6. By means of the electrical junction surfaces 48, an electrical contact may be established to the conductive tracks 26 or the connection surfaces 23. Starting from the junction surfaces 48, a metallization which is U-shaped as seen in cross section is formed, together with the through-contacts 25 and the second contact pads 52.

It is possible that this in particular one-piece and continuous metallization 25, 48, 52 to be set back from a base body 26 of the thickening body 6, so that the junction surfaces 48 and/or the second contact pads 42 do not extend into the recess 40, see FIG. 5A. Conversely, the junction surfaces 48 and the second contact pads 42 according to FIG. 5B are flush with the base body 46 in the direction of the recess 40.

According to FIG. 5C, through-contacts 25 are respectively located inside the base body 46. As seen in cross section, the metallization 25, 48, 52 is therefore configured in an H-shape.

In FIG. 5D, it is shown that the metallization 25, 48, 52 is configured in a U-shape, these U's facing toward one another on the opposite regions of the base body 46. The through-contacts 25 are located inside the base body 46 and not, as in FIGS. 5A and 5B, on side surfaces of the base body 46.

In the sectional representation of FIG. 6A and the plan view of FIG. 6B, a further exemplary embodiment of the semiconductor component 1 is illustrated. In this case, the chip carrier 2 is formed by a plurality of parts of a lead frame 22, on which the semiconductor chip 3 is mounted. A connection to another lead frame part is carried out by means of the bond wires 8.

The lead frame 22 is located in a casting body 7, in which the recess 40 with the optional filler 74 is formed. Starting from the parts of the lead frame 22, conductive tracks 26 are fed along side walls 47 of the recess 40, these conductive tracks 26 opening into the second contact pads 52 at the second fastening side 42.

As seen in plan view, the second contact pads 52 are, for example, configured in a U-shape. The conductive tracks 26 may extend in an X-shape. It is possible for there to be one or more of the conductive tracks 26 per part of the lead frame 22.

Figure 6:
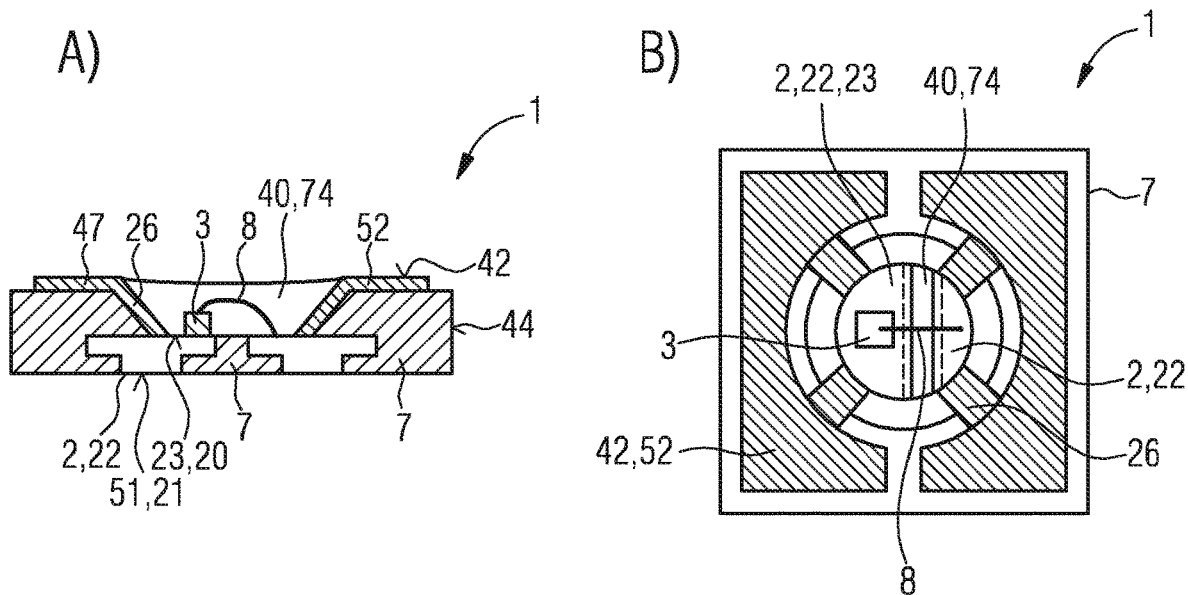
FIGS. 6 to 9 show schematic sectional representations and plan views of exemplary embodiments of optoelectronic semiconductor components as described here.

According to FIG. 6, only one semiconductor chip 3 is provided. The construction of FIG. 6 may be adapted for a plurality of semiconductor chips 3 according to FIG. 3 or 4.

Figure 7:
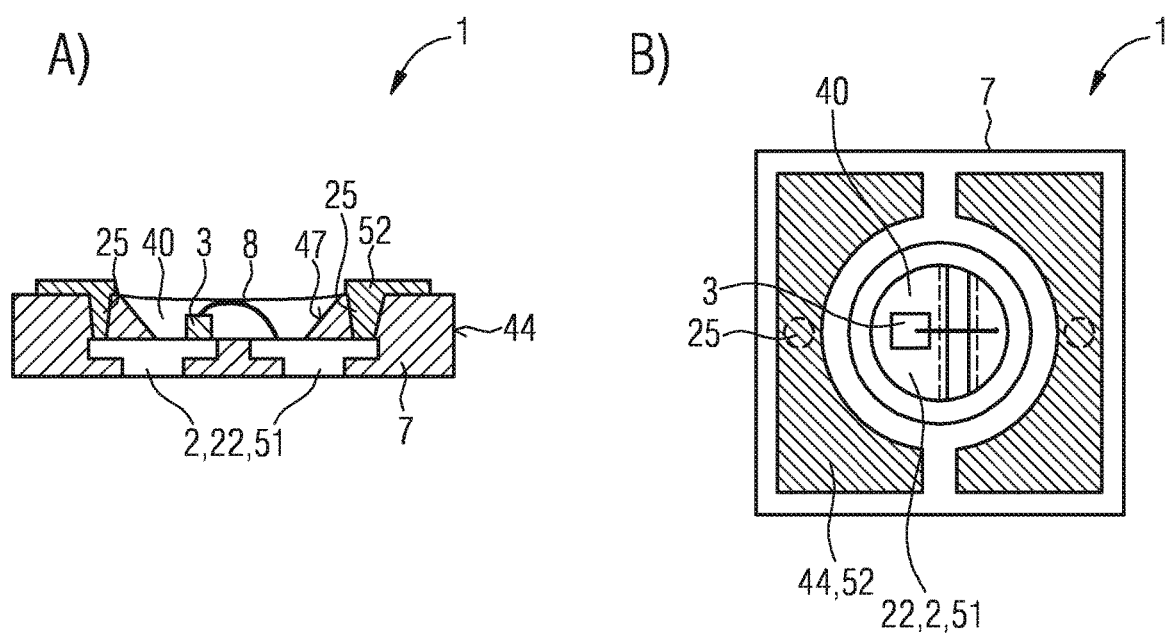

In the exemplary embodiment of FIG. 7, unlike in FIG. 6, the through-contacts 25 are formed through the casting body 7. The through-contacts 25 may widen in the direction toward the parts of the lead frame 22, so that the through-contacts 25 may be configured frustoconically. The second contact pads 52 cover the through-contacts 25 fully. The recesses 40, in particular the side walls 47 thereof, are free of metallizations.

In other regards, the comments regarding FIG. 6 apply correspondingly for FIG. 7. The semiconductor components 1 as illustrated in FIGS. 6 and 7 are therefore so-called QFN components.

In the exemplary embodiment as shown in the sectional representation of FIG. 8A and the plan view in FIG. 8B, the chip carrier 2 is produced as shown in connection with FIG. 1, for example as a PCB or on the basis of a ceramic substrate. Before the casting body 7 of the housing 4 is produced in particular by film-assisted compression molding, the semiconductor chip 3 is mounted. If an RGB component with LED chips emitting different colors is being produced, all the semiconductor chips 3 have the same height or corresponding height-compensating pedestals are provided.

The through-contacts 25 through the casting body 7 are subsequently produced, for example by means of a laser. As an alternative, inserted parts, so-called via plugs, may be put in place before producing the casting body, which are metallized in a subsequent step together with a surface of the casting body 7 in order to complete the through-contact 25 and the conductive tracks 26. The second contact pads 52 are produced at the same time as the conductive tracks 26. In order to simplify the representation, only one of the through-contacts 25 through the casting body 7 is shown in FIG. 8A. The second through-contact 25 (not illustrated in FIG. 8A) is configured as illustrated in FIG. 7A.

The casting body 7 is formed directly onto the semiconductor chip 3, so that the semiconductor chip 3 fully fills the recess 40. In a non-limiting embodiment, the casting body 7 is white and therefore diffusely reflective.

Figure 9:
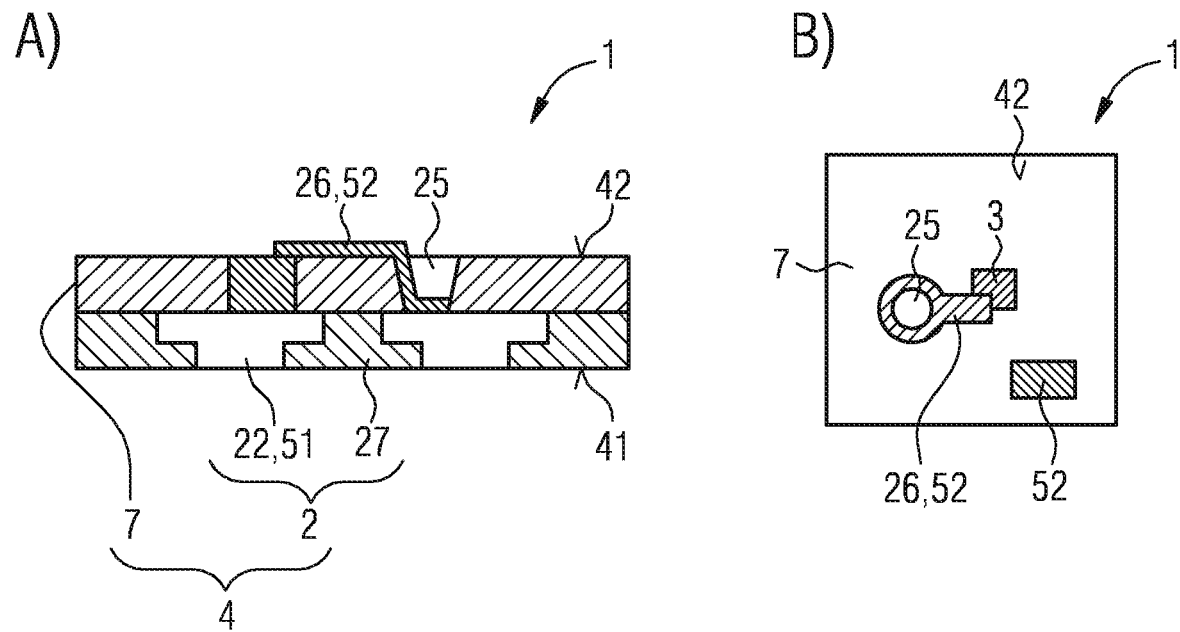

In the exemplary embodiment of FIG. 9, the chip carrier 2 is formed by the base body 27, configured as a casting, together with the lead frame 22, in a similar way to FIG. 7. In this case, the base body 27 and the lead frame 22 may have the same thickness and are flush with one another on their two main sides.

After the semiconductor chip 3 has been mounted, the casting body 7 is then formed on the base body 27 together with the lead frame 22. The comments regarding the casting body 7 and the through-contacts 25 through the casting body 7, as described in connection with FIG. 8, apply correspondingly for FIG. 9.

Figure 8:
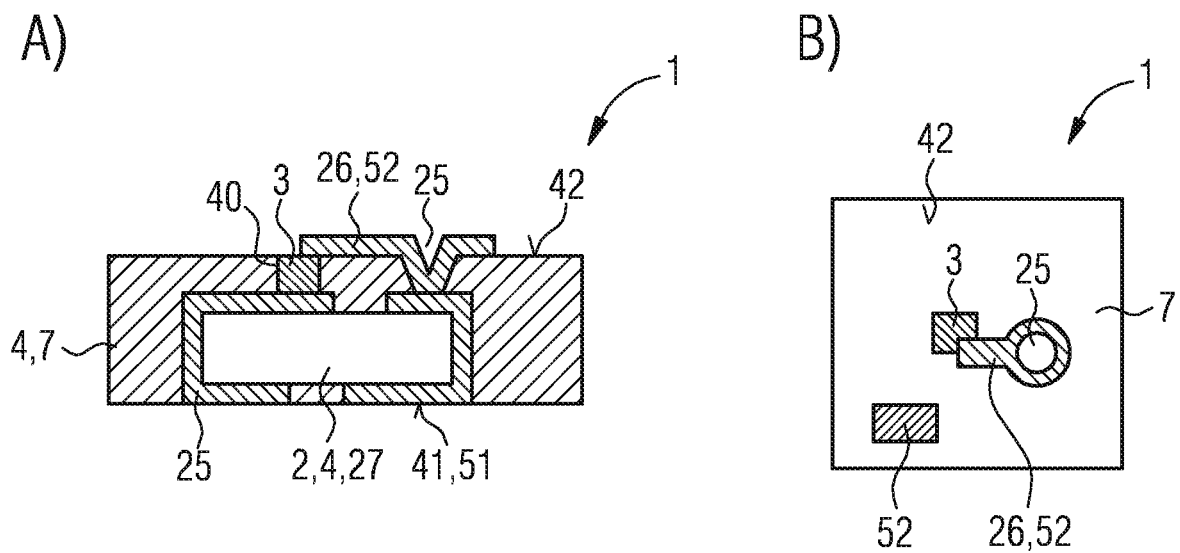

In the designs of FIGS. 8 and 9, as also in all other exemplary embodiments, instead of semiconductor chips 3 to be contacted on both sides, it is respectively possible to use Flip chips, the contact pads of which either face toward the chip carrier 2 or alternatively face away from the chip carrier 2.

Figure 10:
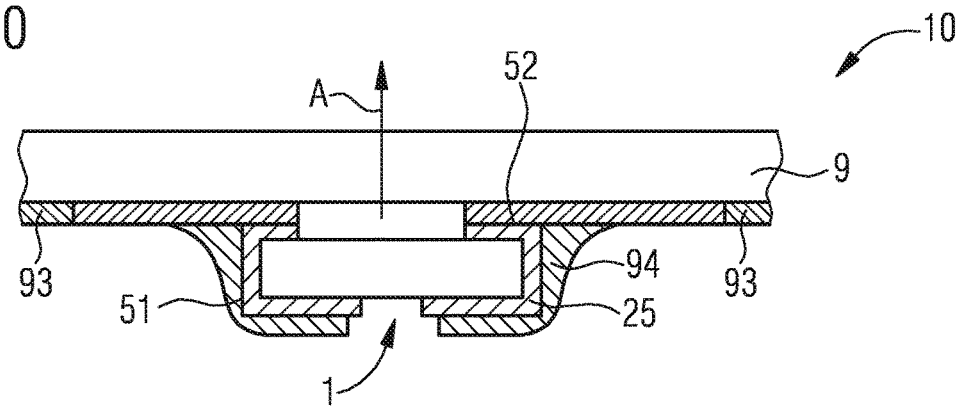
FIGS. 10 to 12 show schematic sectional representations and plan views of arrangement semiconductor components as described here having optoelectronic semiconductor components as described here.

FIG. 10 describes an arrangement 10 having a semiconductor component 1. The arrangement 10 includes a mounting platform line, on which there are transparent electrical feeds 93. The semiconductor component 1 is connected mechanically and electrically to the electrical feeds 93 by means of an electrically conductive adhesive 94. In this case, the adhesive 94 fully wets the metallizations, in particular the through-contacts 25 and the two types of contact pads 51, 52. A reduced contact resistance to the mounting platform 9 may therefore be achieved.

Light emission of the semiconductor component 1 takes place along a first principal emission direction A fully through the mounting platform 9. The mounting platform 9 is also optically transmissive, in particular transparent.

Figure 11:
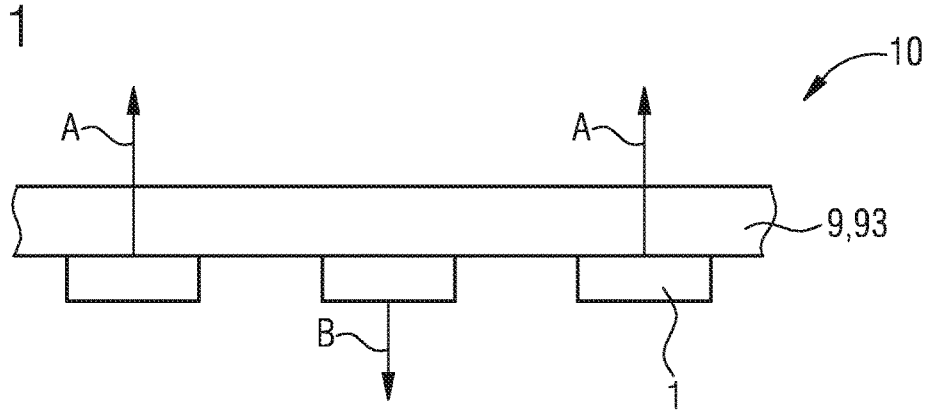

In the exemplary embodiments of the arrangement 10 as illustrated in FIG. 11, a plurality of the semiconductor components 1 are provided. All the semiconductor components 1 have the same construction. Light emission takes place along a first principal emission direction A and a second principal emission direction B, for example in alternation. Light emission therefore takes place along two principal emission directions A, B extending antiparallel to one another, and only partly through the mounting platform 9.

As also in all other exemplary embodiments, a distance between neighboring semiconductor components 1 is relatively large compared with a component size. For example, the distances between the semiconductor components 1 are at least 2 cm or 5 cm and/or at most 50 cm or 15 cm, in particular about 10 cm. The same applies for all other exemplary embodiments.

With the arrangement 10, for example, it is therefore possible to produce a video wall, for instance for representing images, or a display panel or an information unit.

Figure 12:
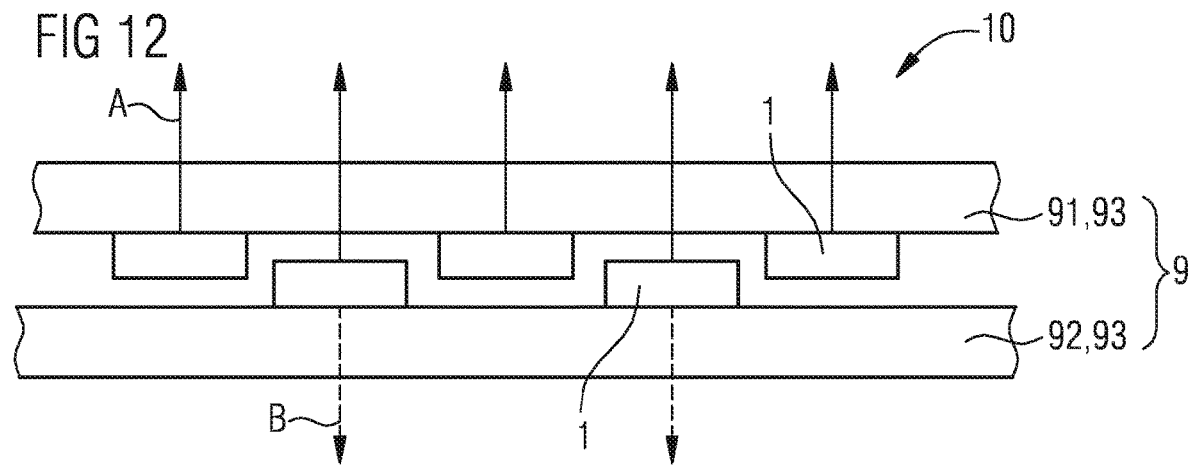

In the exemplary embodiment of FIG. 12, the mounting platform 9 includes a first plate 91 and a second plate 92. Each of the plates 91, 92 is provided with optically transmissive electrical feeds 93. The semiconductor components 1 are, for example, mounted in alternation with one another on the two plates 91, 92. In this case, each of the semiconductor components 1 is only in contact with one of the plates 91, 92. A spacing of the plates 91, 92 is, for example, so small that, in the transverse direction, neighboring semiconductor components 1 that are located on different plates 91, 92 overlap. With this type of mounting, a larger feed area per semiconductor component 1 is available.

The semiconductor components 1 may be mounted in such a way that all the semiconductor components 1 emits along the first principal emission direction A, and therefore in the same direction. Likewise, it is possible that the semiconductor components 1 mounted on the second plate 92 alternatively emit along the second principal emission direction B, so that light emission from the arrangement 10 may then take place on both sides.

In a non-limiting embodiment, the parts shown in the figures may, unless otherwise indicated, respectively follow one another directly in the order specified. Layers which do not touch one another in the figures are separated from one another. If lines are shown as being parallel to one another, the corresponding surfaces are likewise directed parallel to one another. Likewise, unless otherwise indicated, the relative positions of the components shown with respect to one another are reproduced correctly in the figures.

The invention described is not restricted to the description with the aid of the exemplary embodiments. Rather, the invention includes any new feature and any combination of features, which in particular involves any combination of features in the patent claims, even if this feature or this combination is not itself explicitly indicated in the patent claims or exemplary embodiments.

1 semiconductor component
2 chip carrier
20 upper side
21 first fastening side
22 lead frame
23 electrical connection surface
25 through-contact
26 conductive track
27 base body
3 optoelectronic semiconductor chip
4 housing
40 recess
42 second fastening side
44 housing side surface
45 housing outer edge
46 base body
48 electrical junction surface
47 side wall of the recess
51 first electrical contact pad
52 second electrical contact pad
6 thickening body
7 casting body
74 filler
8 bond wire
9 mounting platform
91 first plate
92 second plate
93 electrical feed
94 adhesive
10 arrangement
A first principal emission direction
B second principal emission direction

The invention claimed is:

1. An optoelectronic semiconductor component comprising:
   a housing with a recess, wherein the housing comprises:
      a chip carrier comprising a circuit board or a lead frame, and wherein the chip carrier has a first fastening side and an upper side, wherein the upper side comprises electrical connection surfaces, and
      at least a thickening body mounted on the upper side of the chip carrier,
   at least one optoelectronic semiconductor chip mounted directly on the upper side electrical connection surfaces, wherein the at least one optoelectronic semiconductor chip is arranged completely in the recess on the upper side, and
   wherein:
      first electrical contact pads for external electrical contacting of the semiconductor component are located on the first fastening side, wherein the electrical connection surfaces are connected by through-contacts through the chip carrier to the first electrical contact pads, wherein the electrical connection surfaces, the through-contacts and the first electrical contact pads and the second electrical contact pads are E-shaped as seen in cross section,
      second electrical contact pads for external electrical contacting of the semiconductor component are located on a second fastening side, opposite to the first fastening side, of the housing, and
      the first electrical contact pads and second electrical contact pads are electrically assigned to one another and are electrically short-circuited so that the semiconductor component can be electrically contacted by the first fastening side or by the second fastening side, the recess is limited to the thickening body, so that the chip carrier is free of the recess, and the fastening sides and the upper side are oriented parallel to each other.

2. The optoelectronic semiconductor component as claimed in claim 1,
wherein the through-contacts extend completely along housing side surfaces and/or along housing outer edges of the housing.

3. The optoelectronic semiconductor component as claimed in claim 1,
wherein the at least one optoelectronic semiconductor chip comprises at least three semiconductor chips emitting different colors and electrically drivable independently of one another, which are mounted in a common plane on the upper side,
wherein the housing is opaque to visible light, and
the at least three semiconductor chips are electrically contacted by bond wires, and the bond wires are fully located in the recess.

4. The optoelectronic semiconductor component as claimed in claim 1,
wherein the upper side lies opposite the first fastening side, and
wherein the first fastening side and the second fastening side are the single fastening sides of the semiconductor component.

5. The optoelectronic semiconductor component as claimed in claim 1,
wherein the thickening body at least partially covers the electrical connection surfaces and/or conductive tracks to the electrical connection surfaces.

6. The optoelectronic semiconductor component as claimed in claim 5,
wherein the second fastening side is formed at least partially by the thickening body, so that the second electrical contact pads are at least partially located directly on the thickening body.

7. The optoelectronic semiconductor component as claimed in claim 1,
wherein the chip carrier is at least one lead frame, on which the semiconductor chip is mounted, wherein the lead frame extends from the semiconductor chip as far as the first fastening side, and the first electrical contact pads are formed at least partially by the lead frame.

8. The optoelectronic semiconductor component as claimed in claim 7,
wherein the housing furthermore comprises a casting body, in which the lead frame is embedded and stabilized,
wherein the recess is formed in the casting body, and the casting body forms the second fastening side.

9. The optoelectronic semiconductor component as claimed in claim 8,
wherein the second electrical contact pads are connected to the lead frame by means of through-contacts through the casting body, wherein the through-contacts are covered by the second electrical contact pads, and
wherein the recess is free of the second electrical contact pads and free of the through-contacts.

10. The optoelectronic semiconductor component as claimed in claim 8,
wherein the second electrical contact pads are connected to the lead frame by conductive tracks, which extend along side walls of the recess, so that housing side surfaces of the housing are free of electrically functionalized parts of the semiconductor component.

11. The optoelectronic semiconductor component as claimed in claim 10, wherein the chip carrier is a circuit board, wherein the upper side is provided with electrical connection surfaces to which the semiconductor chip is directly electrically connected, wherein the conductive tracks extend to the electrical connection surfaces, and wherein the thickening body at least partially covers the conductive tracks.

12. A device comprising:
a plurality of optoelectronic semiconductor components, wherein each optoelectronic semiconductor component comprises:
a housing with a recess, wherein the housing comprises:
a chip carrier comprising a circuit board or a lead frame, and wherein the chip carrier has a first fastening side and an upper side, wherein the upper side comprises electrical connection surfaces, and
at least a thickening body mounted on the upper side of the chip carrier,
at least one optoelectronic semiconductor chip mounted directly on the upper side electrical connection surfaces, wherein the at least one optoelectronic semiconductor chip is arranged completely in the recess on the upper side, and
wherein:
first electrical contact pads for external electrical contacting of the semiconductor component are located on the first fastening side,
second electrical contact pads for external electrical contacting of the semiconductor component are located on a second fastening side, opposite to the first fastening side, of the housing, and
the first electrical contact pads and second electrical contact pads are electrically assigned to one another and are electrically short-circuited so that the semiconductor component can be electrically contacted by the first fastening side or by the second fastening side,
the recess is limited to the thickening body, so that the chip carrier is free of the recess, and
the fastening sides and the upper side are oriented parallel to each other; and
a reflective or optically transmissive mounting platform,
wherein the plurality of optoelectronic semiconductor components are electrically and mechanically mounted on electrical feeds of the mounting platform, and
wherein an average distance between neighboring optoelectronic semiconductor components is greater by a factor of at least 5 than an average diagonal length of the semiconductor components.

13. The device as claimed in claim 12,
wherein the plurality of optoelectronic semiconductor components are bonded electrically conductively onto the optically transmissive electrical feeds by an adhesive,
wherein the adhesive extends from the fastening side facing toward the electrical feeds as far as the fastening side facing away from the electrical feeds, and wherein a first set of the semiconductor components emits in a first principal emission direction and a second set of the semiconductor components emit in a second principal emission direction antiparallel to the first principal emission direction.

14. The device as claimed in claim 12,
wherein the mounting platform comprises a first plate and a second plate, between which the plurality of semiconductor components are mounted,
wherein the semiconductor components are each electrically and mechanically connected only to the first plate or to the second plate.

15. The device as claimed in claim 14, wherein the thickening body of each optoelectronic semiconductor component at least partially covers the electrical connection surfaces.

16. An optoelectronic semiconductor component comprising:
a housing with a recess, wherein the housing comprises:
  a chip carrier comprising a circuit board or a lead frame, and wherein the chip carrier has a first fastening side and an upper side, wherein the upper side comprises electrical connection surfaces, and
  at least a thickening body mounted on the upper side of the chip carrier, wherein the thickening body at least partially covers the electrical connection surfaces and/or conductive tracks to the electrical connection surfaces,
  at least one optoelectronic semiconductor chip mounted directly on the upper side electrical connection surfaces, wherein the at least one optoelectronic semiconductor chip is arranged completely in the recess on the upper side, and
wherein:
  first electrical contact pads for external electrical contacting of the semiconductor component are located on the first fastening side,
  second electrical contact pads for external electrical contacting of the semiconductor component are located on a second fastening side, opposite to the first fastening side, of the housing, and
  the first electrical contact pads and second electrical contact pads are electrically assigned to one another and are electrically short-circuited so that the semiconductor component can be electrically contacted by the first fastening side or by the second fastening side,
  the recess is limited to the thickening body, so that the chip carrier is free of the recess, and
  the fastening sides and the upper side are oriented parallel to each other.

\* \* \* \* \*